(12) United States Patent
Lee

(10) Patent No.: US 8,692,750 B2
(45) Date of Patent: Apr. 8, 2014

(54) LIQUID CRYSTAL DISPLAY DEVICE HAVING GOLDD TYPE TFT AND LDD TYPE TFT AND METHOD OF MAKING SAME

(75) Inventor: Seok-Woo Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 2139 days.

(21) Appl. No.: 11/139,980

(22) Filed: May 31, 2005

(65) Prior Publication Data

US 2005/0266595 A1    Dec. 1, 2005

(30) Foreign Application Priority Data

May 31, 2004 (KR) .................. 10-2004-0039340

(51) Int. Cl.
*G09G 3/36* (2006.01)
*G06F 3/041* (2006.01)

(52) U.S. Cl.
USPC ........................................... 345/87; 345/178

(58) Field of Classification Search
USPC ........... 345/87, 88, 89, 90, 92, 94, 95, 96, 98, 345/99, 100, 103, 204, 205, 206, 207, 208, 345/209, 210, 211, 214, 690, 691, 692, 345/693; 349/33, 34, 36, 37, 38, 39, 41, 42, 349/43, 44, 45, 46, 47, 48, 49, 50, 51, 52, 349/53, 54, 55; 257/128, 333, 336, 344, 257/346, 366, 387, 388, 408, 900
See application file for complete search history.

(56) References Cited

U.S. PATENT DOCUMENTS

| | | | | |
|---|---|---|---|---|
| 5,198,379 A | * | 3/1993 | Adan | 438/151 |
| 5,485,019 A | * | 1/1996 | Yamazaki et al. | 257/57 |
| 5,521,107 A | * | 5/1996 | Yamazaki et al. | 438/303 |
| 5,821,559 A | * | 10/1998 | Yamazaki et al. | 257/57 |
| 5,949,107 A | * | 9/1999 | Zhang | 257/347 |
| 6,180,957 B1 | * | 1/2001 | Miyasaka et al. | 257/347 |
| 6,252,248 B1 | * | 6/2001 | Sano et al. | 257/59 |
| 6,330,044 B1 | * | 12/2001 | Murade | 349/44 |
| 6,362,507 B1 | * | 3/2002 | Ogawa et al. | 257/350 |
| 6,424,012 B1 | * | 7/2002 | Kawasaki et al. | 257/350 |
| 6,479,333 B1 | * | 11/2002 | Takano et al. | 438/159 |
| 6,512,504 B1 | * | 1/2003 | Yamauchi et al. | 345/87 |
| 6,603,453 B2 | * | 8/2003 | Yamazaki et al. | 345/92 |
| 6,603,455 B1 | | 8/2003 | Zhang et al. | |
| 6,740,938 B2 | * | 5/2004 | Tsunoda et al. | 257/365 |
| 6,893,503 B1 | * | 5/2005 | Ohnuma et al. | 117/94 |
| 6,953,951 B2 | * | 10/2005 | Yamazaki et al. | 257/72 |
| 7,038,283 B2 | | 5/2006 | Yanai et al. | |

(Continued)

FOREIGN PATENT DOCUMENTS

| | | |
|---|---|---|
| JP | 11-133877 | 5/1996 |
| JP | 8-220505 | 8/1996 |

(Continued)

*Primary Examiner* — Michael Faragalla
(74) *Attorney, Agent, or Firm* — Morgan, Lewis & Bockius LLP

(57) ABSTRACT

A liquid crystal display device includes a display region having unit pixels arranged thereon in a matrix, and a driving circuit unit having at least a LDD (Lightly Doped Drain) type TFT and a GOLDD (Gate overlapped Lightly Doped Drain) type TFT.

6 Claims, 6 Drawing Sheets

(56) References Cited

U.S. PATENT DOCUMENTS

| | | | |
|---|---|---|---|
| 7,189,997 B2* | 3/2007 | Tsunoda et al. | 257/72 |
| 7,233,342 B1* | 6/2007 | Yamazaki et al. | 345/692 |
| 7,276,730 B2* | 10/2007 | Yamazaki et al. | 257/59 |
| 2001/0030722 A1* | 10/2001 | Murade | 349/110 |
| 2002/0014624 A1* | 2/2002 | Yamazaki et al. | 257/57 |
| 2002/0070382 A1* | 6/2002 | Yamazaki et al. | 257/72 |
| 2003/0057853 A1* | 3/2003 | Ino | 315/169.3 |
| 2004/0217354 A1* | 11/2004 | Kamo et al. | 257/72 |

FOREIGN PATENT DOCUMENTS

| | | |
|---|---|---|
| JP | 10-268254 | 10/1998 |
| JP | 2000-194014 | 7/2000 |
| JP | 2001-77373 | 3/2001 |
| JP | 2001-77374 | 3/2001 |
| JP | 2001-111060 | 4/2001 |
| JP | 2001-265243 | 9/2001 |
| JP | 2001-320053 | 11/2001 |
| JP | 2003-45892 | 2/2003 |

* cited by examiner

LIQUID CRYSTAL DISPLAY DEVICE HAVING GOLDD TYPE TFT AND LDD TYPE TFT AND METHOD OF MAKING SAME

This application claims the benefit of Korean Application No. 2004-39340 filed in Korea on May 31, 2004, which is hereby incorporated by reference in its entirety.

BACKGROUND OF THE INVENTION

1. Field of the Invention

The present invention relates to a liquid crystal display device and a fabrication method thereof, and particularly, to a liquid crystal display device having both GOLDD (Gate Overlapped Lightly Doped Drain) type and LDD (Lightly Doped Drain) type thin film transistors and a fabrication method thereof.

2. Description of the Related Art

Recently, research for lighter, more compact flat panel display devices have resulted in liquid crystal display (LCD) devices being mass-produced and widely used. LCD devices usually use thin film transistors (TFT). TFTs in a LCD device are used as switching devices to individually drive each respective pixel. A TFT includes a semiconductor layer having a channel formed therein through which a current flows, a gate electrode for controlling the currently by applying a scanning signal to turn the current on and off a source electrode for inputting data signals, and a drain electrode for outputting data signals.

The LCD includes a pixel region having a plurality of pixels therein for displaying real images, and a driving circuit unit for applying various signals to the pixel region. The TFT makes up all of the pixel region and the driving circuit unit. For Chip On Glass (COG) type LCD, which has the driving circuit unit and pixel region on the same substrate, research to form a compact LCD has been mainly achieved by providing the driving circuit unit with a polycrystalline TFT.

The TFT formed in the driving circuit unit has to have higher electric mobility as compared with the TFT formed in the pixel region. Accordingly, the polycrystalline TFT having high electric mobility is usually applied in the driving circuit unit.

Recently, attempts have been made to further minimize the LCD to form a lighter and more compact display apparatus. However, since the pixel region in which images are displayed cannot be further reduced, (the size of this pixel region has already been established), the size reduction of the LCD is substantially achieved by reducing the area of the driving circuit unit. Thus, when the area of the driving circuit unit is reduced, the size of the TFT arranged in the driving circuit unit is inevitably reduced as well. The reduction of the TFT is achieved by reducing the length of the channel. Reducing the length of the channel, however, make the channel layer prone to damage by generating hot carriers on the channel. The hot carriers trapped within the channel change the threshold voltage of a device creating a defect.

To solve this problem, a LDD (Lightly Doped drain) type TFT has been introduced. The LDD type TFT has a low concentration impurity region. The LDD region is formed adjacent to the channel layer and a high concentration impurity region is formed outside of the LDD region. Furthermore, since LDD type TFT hardly generates any off current, it may prevent leakage currents that cause degradation of image quality.

However, in the LDD type TFT, there is a limit on how much the channel length can be reduced. Reliability of the TFT declines as the channel length gets shorter. Therefore, when the TFT having short channel length is applied to display apparatuses of high image qualities such as HDTV, the channel may be damaged due to hot carrier effects.

A TFT having a GOLDD (Gate Overlapped LDD) type is proposed to solve those problems. In the GOLDD type TFT, since a gate electrode is overlapped with an LDD region, it is possible to form a short channel. As a result, a small-sized TFT with reliability can be fabricated.

Hereinafter, a fabrication process for the GOLDD type TFT according to the related art is discussed with reference to FIGS. 1A through 1F.

First, as shown in FIG. 1A, a buffer layer 102 is formed on a substrate 101, which is made of a transparent material like glass. Next, a semiconductor layer 103 is formed on the buffer layer 102 by depositing an amorphous semiconductor such as a silicon and patterning it. Thereafter, a photoresist pattern 104 is formed on the semiconductor layer 103 and then low concentration impurity ion (i.e., n– ion) is injected into the exposed region of the semiconductor layer 103 not blocked by the photoresist pattern. The result is the formation of a channel layer 103a and low concentration impurity region 103b, the n– region.

Next, as shown in FIG. 1B, after removing the photoresist pattern 104 on the channel layer 103a, a laser beam is irradiated on the semiconductor layer 103 to crystallize the amorphous semiconductor layer. When the laser beam is irradiated on the semiconductor layer 103, the impurity ion injected in the n– region 103b is activated.

Next, as shown in FIG. 1C, a gate insulating layer 105 is formed on the semiconductor layer 103. Thereafter, a metal layer 106 is formed on the gate insulating layer 105.

Referring to FIG. 1D, a photoresist pattern 107 is formed on the metal layer 106 and photolithography process is performed to create gate electrode 106a. The size of the gate electrode 106a is greater than the channel layer 103a.

Next, referring to FIG. 1E, high concentration impurity ion ($n^+$ ion) is injected into the n– region 103b by using the gate electrode 106a as a mask. A part of each n– layer 103b (i.e., regions where are not blocked by the gate electrode 106a) becomes high concentration impurity region 103c ($n^+$ region). As a result, the gate electrode 106a is overlapped with low concentration impurity regions 103b'.

After forming the high concentration impurity layer 103c, as shown in FIG. 1F, a passivation layer 108 is formed on the gate electrode 106a. A conductive layer is deposited on the passivation layer 108 and is etched to form a source electrode 109 and a drain electrode 110.

The source electrode 109 and the drain electrode 110 are connected to the n+ region 103c respectively through contact holes exposing the n+ region 103c.

Accordingly, the GOLDD type TFT has low concentration impurity ion region and high concentration impurity ion region similar to that of LDD type TFT. The GOLDD type TFT has superior reliability but cannot readily be reduced in size. On the other hand, the LDD type TFT is advantageous for its small-size but its reliability is degraded due to minimization.

SUMMARY OF THE INVENTION

Accordingly, the present invention is directed to a liquid crystal display device that substantially obviates one or more of the problems due to limitations and disadvantages of the related art.

Therefore, an object of the present invention is to form a more compact liquid crystal display device by decreasing the area of a driving circuit unit in a substrate. More particularly, an object of the present invention is to form an optimal driving circuit unit and a more compact liquid crystal display device by selectively applying LDD type TFT and GOLDD type TFT to various driving devices formed in the driving circuit unit according to driving voltages thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages in accordance with the purpose of the present invention as embodied and broadly described herein, a liquid crystal display device includes a display region having unit pixels arranged thereon in a matrix, and a driving circuit unit having at least a LDD (Lightly Doped Drain) type TFT and a GOLDD (Gate overlapped Lightly Doped Drain) type TFT.

In another aspect, a liquid crystal display device includes an image display unit having unit pixels arranged thereon in a matrix, and a driving circuit unit formed by a first CMOS including LDD type TFT and a second CMOS including GOLDD type TFT according to a driving voltage.

In yet another aspect, a method for fabricating a driving circuit unit integrated liquid crystal display device includes the steps of designating a display region and a driving circuit region on a substrate, forming unit pixels in the display region in a matrix, forming at least one driving unit in the driving circuit region, the driving unit including a first driving section, a second driving section, and a third driving section, forming a LDD type NMOS in the first driving section, a GOLDD type TFT in the second driving section, and a PMOS in the third driving section, and simultaneously forming a first CMOS by paring the LDD type NMOS with the PMOS and a second CMOS by pairing the GOLDD type TFT with the PMOS.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

In general, a liquid crystal display panel includes an array substrate having unit pixels arranged therein as a matrix and a color filter substrate facing the array substrate. Liquid crystal is filled in the gap between the array substrate and the color filter substrate. The array substrate may be divided into an image display unit having unit pixels formed therein and a driving circuit unit for applying a driving signal to the image display unit.

Figure 1A:
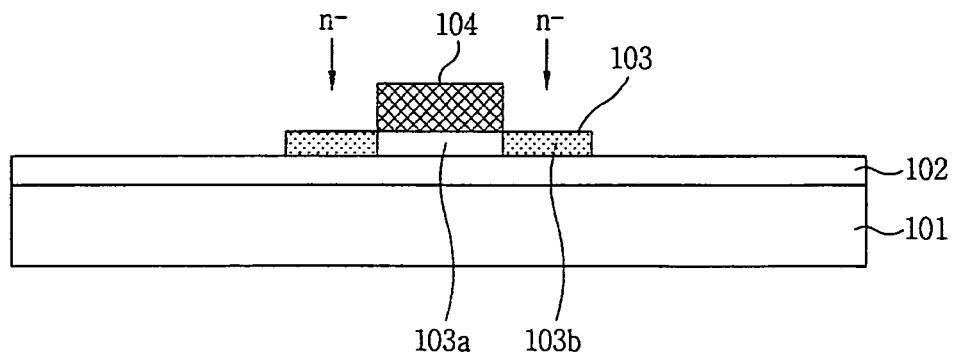
FIGS. 1A to 1F show procedures of fabricating a GOLDD type TFT according to the related art.
Figure 1B:
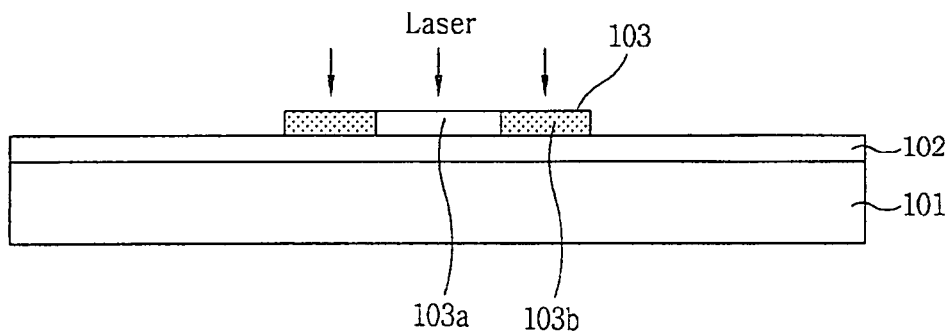
Figure 1C:
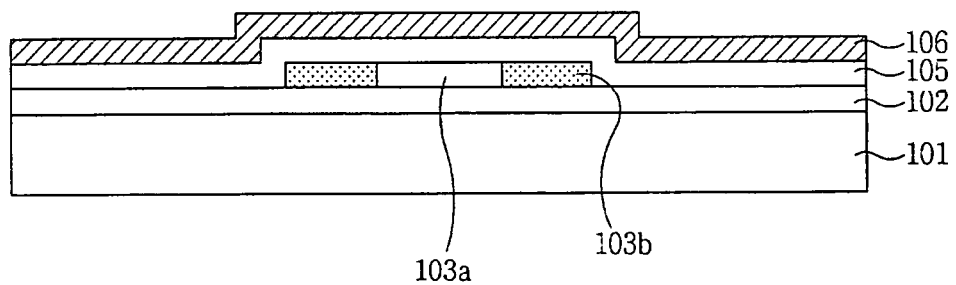
Figure 1D:
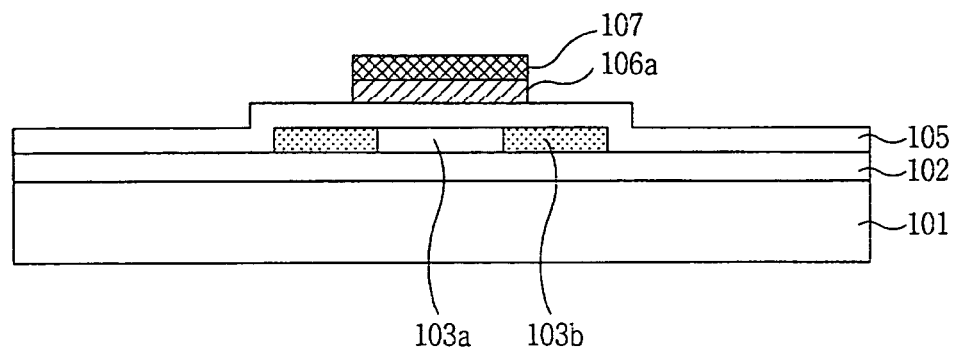
Figure 1E:
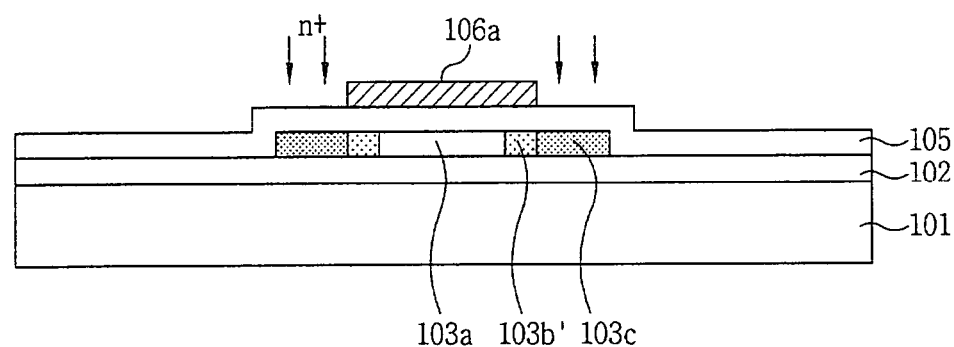
Figure 1F:
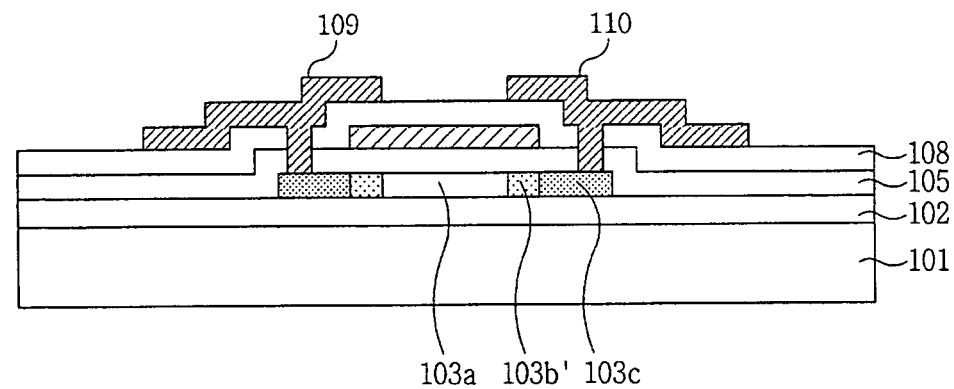
Figure 2:
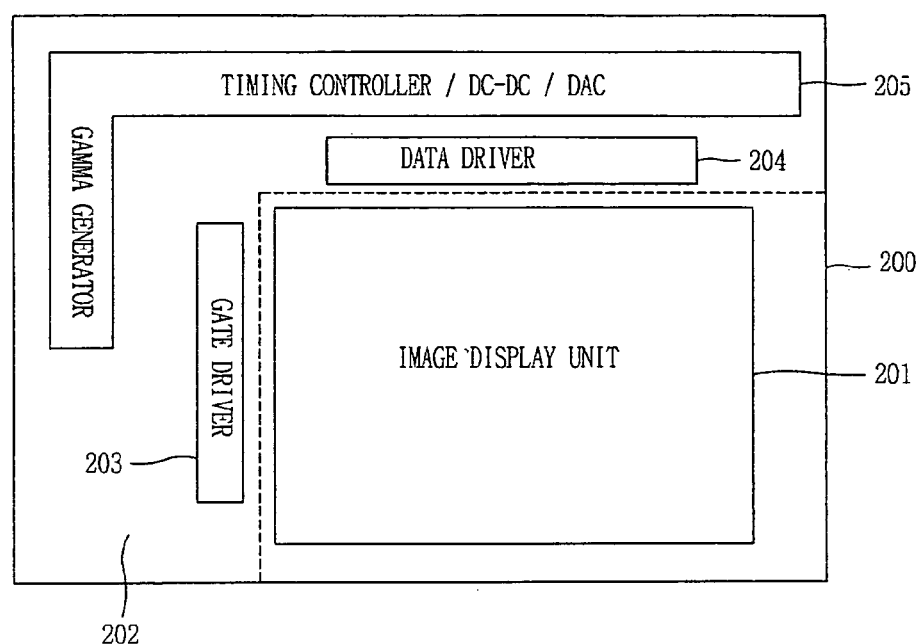
FIG. 2 is a plan view showing an array substrate according to the present invention.

FIG. 2 shows a structure of an array substrate of a liquid crystal display device according to the present invention. As shown in FIG. 2, an image display unit 201 is formed at a predetermined position on substrate 200, and driving circuit unit 202 equipped with various driving circuits is positioned outside of the image display unit 201.

Particularly, SOG (Silicon on Glass) technique to form a driving circuit unit driving a display region and a display region displaying the image on the same substrate has been developed with creation of a polycrystalline silicon TFT. Accordingly, processes for fabricating a liquid crystal display panel has been simplified making it possible to make compact liquid crystal panels using the SOG technique. One of the main factors for this process is the use of polysilicon as a channel of TFT. Polysilicon has superior electric conductivity relative to amorphous silicon. Therefore, a driving circuit unit and a switching device of an display region are formed using polysilicon TFT in which the polysilicon is adopted as a channel.

A P-type TFT or an N-type TFT may selectively be used as the switching device of the display region. A CMOS (Complementary Metal Oxide Silicon) in which NMOS and PMOS make a pair is used as a driving device of the driving circuit unit. Specifically, the NMOS is an LDD type polysilicon TFT to control leakage current caused by carrier electrons.

A driving circuit unit can adopt the CMOS as a driving device. Here, the CMOS may be formed by using GOLDD type TFT instead of using LDD type NMOS. That is, the CMOS is configured in the driving circuit unit as a combination of LDD type TFT+PMOS and GOLDD type TFT+PMOS to prevent leakage current while optimizing a minimization of the driving circuit unit.

As shown in FIG. 2, the driving circuit unit 202 of the array substrate 200 includes gate driver 203 for supplying gate signals to gate lines of the display region 201 and data driver 204 for applying data signals to data lines. The data lines cross vertically to the gate lines, which are formed in the display region 201. The two drivers 203 and 204 are adjacent to the display region 201.

The driving circuit unit 202 further includes a timing controller 205 for generating control signals to be supplied to the gate driver and the data driver by receiving signals inputted from the exterior. To supply the generated control signals to the gate and data drivers, a DC-DC converter for converting a DC voltage input from the exterior into a DC voltage required for driving the liquid crystal display panel, a DA (Digital-to-Analog) converter for converting a digital signal inputted from the exterior into an analog signal, a gamma voltage generator and a common voltage (Vcom) driver for adjusting a common voltage are also included. Various devices in the driving circuit unit are formed by CMOS.

In forming the CMOS, driving devices operating at a relatively high voltage are formed by CMOS using GOLDD type TFT to prevent leakage currents usually generated during operation at high voltages. Driving devices operating at a relatively low voltage are configured by CMOS using LDD type NMOS. As a result, driving stability and area reduction are achieved.

For instance, an output buffer block within the gate driver, a level shifter in the driving circuit unit, a pixel switching TFT in the display region, and all other devices driven by high voltage more than 10V are formed by CMOS adopting GOLDD type TFT. On the other hand, a timing controller, a shift resistor within the data driver, a DC-DC converter, a Vcom driver, and all other devices driven by a low voltage less than 10V are formed by CMOS adopting LDD type TFT. Using these configurations, the driving circuit unit may be optimized for reliability and area reduction by utilizing both the LDD type TFT, which is capable of area reduction effect, and the GOLDD type TFT with superior reliability.

Hereinafter, the CMOS fabrication process for the driving circuit unit will be explained with reference to FIGS. 3A to 3F.

The driving circuit unit according to the present invention uses a CMOS having a pair of LDD type NMOS and PMOS and another CMOS having a pair of GOLDD type TFT and PMOS. For reference, the fabrication processes for LDD type NMOS, GOLDD type TFT and PMOS will be explained.

Figure 3A:
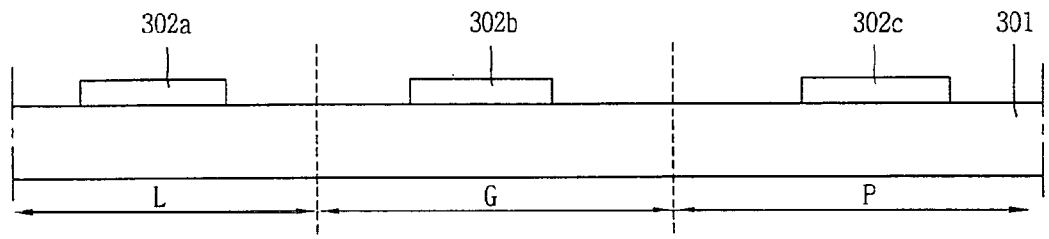
FIGS. 3A to 3F show procedures of fabricating a GOLDD type TFT, an LDD type TFT, and a PMOS according to the present invention.

First, referring to FIG. 3A, active layers 302a, 302b, and 302c are formed respectively on predetermined regions (i.e., LDD type TFT region L, GOLDD type TFT region G, and PMOS region P) of a transparent substrate 301.

A process for forming the active layers 302a, 302b, and 302c is achieved by forming an amorphous silicon layer on the substrate 301 using PECVD (Plasma Enhanced Chemical Vapor Deposition) method and patterning the amorphous silicon layer by a photomask process. In other words, the process for forming the active layers 302a, 302b, and 302c includes the steps of depositing the amorphous silicon layer on the substrate 301 by the PECVD method, coating a photoresist (not shown) on the amorphous silicon layer, exposing and developing the photoresist by applying a mask, and patterning the amorphous silicon by using the developed photoresist pattern.

Figure 3B:
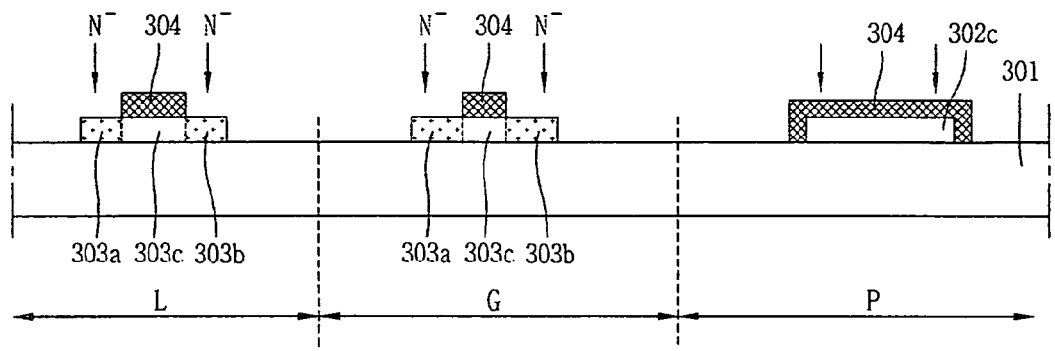

As shown in FIG. 3B, after forming the active layers 302a, 302b, and 302c, photoresist patterns 304 are formed on the active layers 302a, 302b, and 302c through a photomask process. The photoresist patterns 304 define channel regions for the active layers 302a and 302b on the LDD type TFT region L and the GOLDD type TFT region G, and cover the entire active layer 302c on the PMOS region. The photoresist patterns 304 on the active layers 302a and 302b cover each channel region 303c of the active layers 302a and 302b and expose the residual regions.

Afterwards, low concentration impurity ion is injected by using the photoresist pattern 304 as an impurity blocking mask. Group five element such as phosphorous (P) may be used as the impurity ion injected. According to the ion injection, low concentration impurity ion is injected into exposed parts of the active layers 302a and 302b on the LDD type TFT region L and the GOLDD type TFT region G, namely, regions which are not covered with the photoresist 304. Accordingly, no impurity ion is injected into the active layer 302c on the PMOS region P since it is covered with the photoresist pattern 304.

Figure 3C:
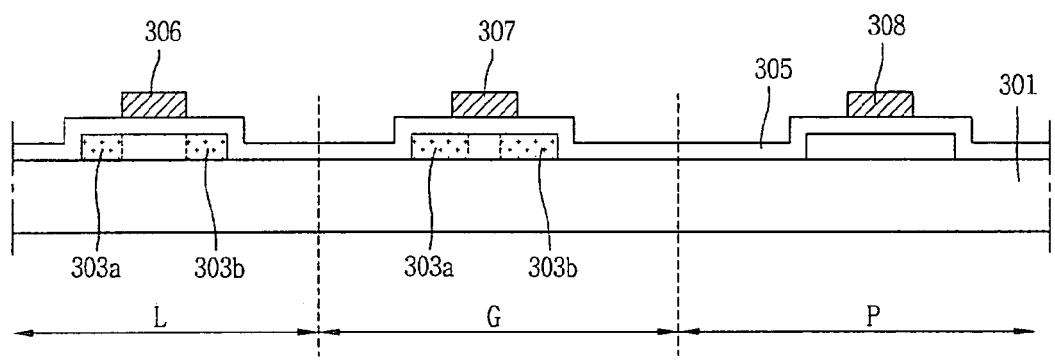

Thereafter, as shown in FIG. 3C, a gate insulating layer 305 made of a silicon oxide film (SiO2) is formed over the active layers 302a, 302b, and 302c by the (PECVD) method. A metal layer, such as aluminum (Al) or the like, is formed on the gate insulating layer 305. Through the photolithography process, gate electrodes 306, 307, and 308 are formed thereon. Gate electrode 307 formed on the GOLDD type TFT region G is bigger than the gate electrode 306 formed on the LDD type TFT region L. This is to form low concentration impurity regions under the gate electrode 307 on the GOLDD type TFT region G.

Figure 3D:
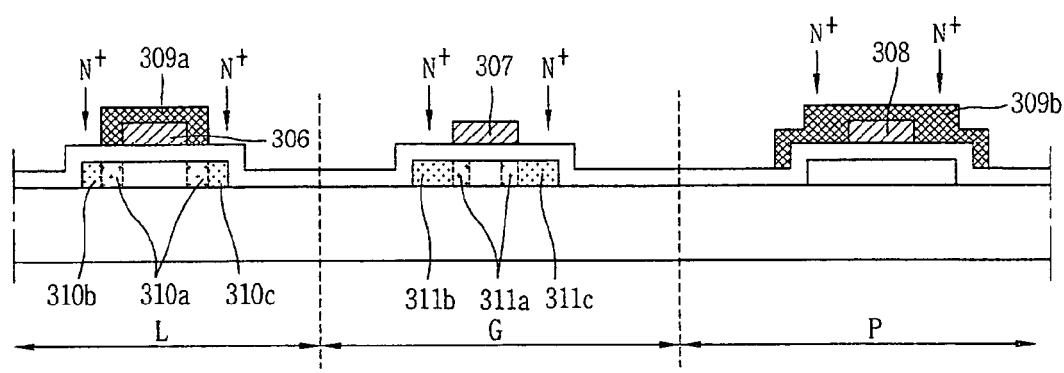

Next, as shown in to FIG. 3D, photoresist patterns 309a and 309b are formed on the gate electrodes 306 and 308. Here, the photoresist pattern 309a covers the entire gate electrode 306 and a part of the low concentration impurity region 303a and 303b of the LDD type TFT region L. The photoresist pattern 309b is formed on the PMOS region P to cover the entire PMOS region. No photoresist pattern is formed on the GOLDD type TFT region G.

Next, high concentration impurity ion is injected into exposed low concentration impurity regions 303a and 303b of the LDD type TFT region L and the GOLDD type TFT region G. As a result, high concentration impurity regions 310b and 310c, the source and drain regions, respectively, are formed in the LDD type TFT region L. LDD region 310a is defined at adjacent regions of the channel. Moreover, high concentration impurity regions 311b and 311c, the source and drain regions, respectively, are formed in low concentration impurity regions 303a and 303b of the GOLDD type TFT region G. Low concentration impurity region 311a under the gate electrode 307 is defined as LDD region 311a. The injected high concentration impurity ion may be group five element such as phosphorous (P). While the source and drain regions of the LDD type TFT region L and the GOLDD type TFT region G are formed by injecting the high concentration impurity ion, the active layer on the PMOS region P is covered with the photoresist to prevent the impurity from getting injected thereinto.

Figure 3E:
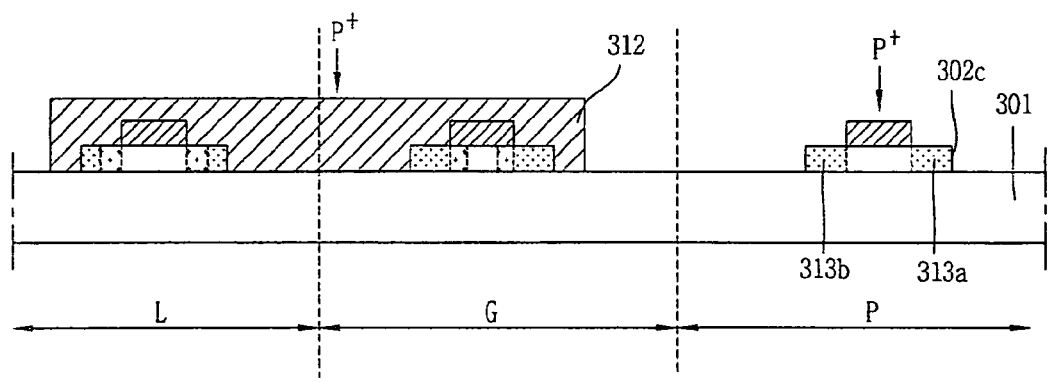

Next, as shown in FIG. 3E, both the LDD type TFT region L and the GOLDD type TFT region G are covered with photoresist pattern 312. Here, the PMOS region P is not covered with the photoresist.

Next, a high concentration impurity ion of group three element such as boron (B) is injected into these regions using photoresist 312 as a blocking mask. At this time, the high concentration P type impurity ion is injected into source and drain regions 313a and 313b of the PMOS region P to thereby form a PMOS. As a result of these processes, LDD type NMOS, GOLDD type TFT, and PMOS are formed. As aforementioned, the LDD type NMOS is formed at low voltage driving device regions using less than 10V, and the GOLDD type TFT is formed at relatively high voltage driving device regions using more than 10V.

Figure 3F:
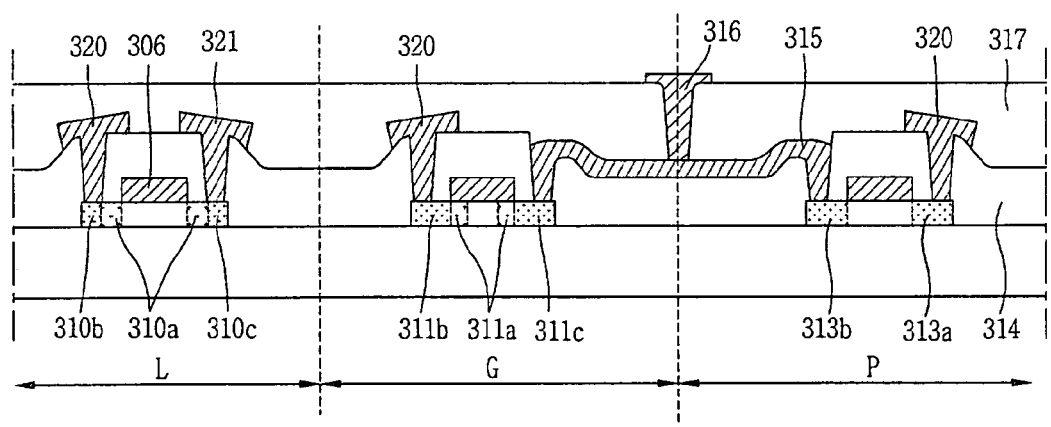

Next, as shown in FIG. 3F, a CMOS is formed by making the LDD type NMOS and the PMOS a pair while simultaneously another CMOS is formed by making the GOLDD type TFT and the PMOS a pair. FIG. 3F is an example of a configuration for the CMOS connecting the GOLDD type TFT and the PMOS.

After completing the TFT, an insulating layer 314 is formed over the entire substrate, and contact holes for exposing the source and drain regions of the TFT are formed on the insulating layer 314.

Next, source electrode 320 and drain electrode 321 connected to the source and drain regions through the contact holes are formed. In this step of forming the source electrode 320 and the drain electrode 321, a common drain electrode 315 is formed to connect the drain electrode 313b on the PMOS and the drain electrode 311c on the GOLDD type TFT.

Next, a passivation layer 317 is formed on the source and drain electrodes, and a drain connection terminal 316 connected to the common drain electrode 315 is formed. Meanwhile, the TFT as a switching device of the display region may be formed simultaneously with the above fabrication process for the CMOS in the driving circuit unit. The TFT in the display region may be formed by selecting either the PMOS or the NMOS. Furthermore, when the switching device of the image display unit is driven at a high voltage, the GOLDD type TFT with superior reliability may be used as the switching device. As a result, the driving circuit unit integrated liquid crystal panel including both the LDD type TFT and the GOLDD type TFT may be achieved.

In fabricating the driving circuit unit integrated liquid crystal panel according to the present invention, the CMOS adopting the GOLDD type TFT is formed in devices driven by a relatively high driving voltage, while another CMOS adopting the LDD type TFT is formed in devices driven by a relatively low driving voltage. As a result, the driving circuit unit integrated liquid crystal panel which satisfy both an area reduction of the driving circuit unit and reliability thereof can be fabricated. Furthermore, since these processes are carried out without extraneous mask processes, efficiencies in fabrication of the liquid crystal panel is improved.

Figure 4:
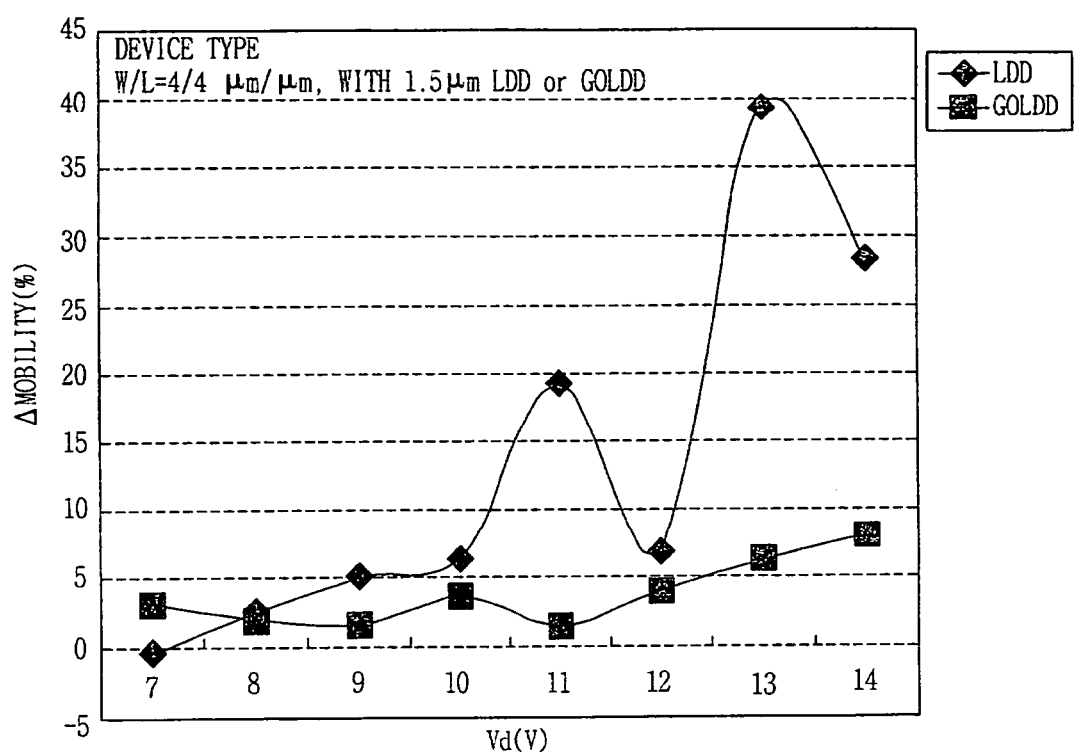
FIG. 4 is a graph showing performance results illustrating variations of drain voltage and electric mobility of LDD type and GOLDD type TFTs according to the present invention.

In accordance with an exemplary embodiment of the present invention, among TFTs positioned in the driving circuit unit, a GOLDD type TFT is driven by a high voltage more than 10V and an LDD type TFT is driven by a low voltage less than 10V. FIG. 4 is a graph showing an experimental result that illustrates variations of drain voltage and electric mobility of LDD type and GOLDD type TFTs for which width and length of a channel is 4 μm, respectively, and length of an LDD region is 1.5 μm. The graph illustrates the the variations of electric mobility of the LDD type TFT as compared to that of the GOLDD type TFT.

As shown in FIG. 4, when the drain voltage Vd becomes greater than 10V, the electric mobility of the LDD type TFT having the above-described dimensions varies drastically while that of the GOLDD type TFT having the above-described dimensions remains relatively stable. This experimental result demonstrates that application of CMOS composed of the GOLDD type device is preferred for circuits requiring a high driving voltage to increase reliability. For circuits requiring a low driving voltage, application of CMOS composed of the LDD type device is preferred since LDD type devices are relatively smaller in size than the GOLDD type device while reliability is not affected.

The drain voltage at which the electric mobility becomes unstable varies based on the dimensions of the TFT devices. Considering these characteristics of the variations of the drain voltage and the electric mobility, the LDD type TFT is used when the variation of the electric mobility of the polysilicon TFT is less than 7% while the GOLDD type TFT is used when the variation of the electric mobility is more than 7%. Thus, a driving circuit integrated liquid crystal display panel, which simultaneously satisfies reduction of dimension and increase in reliability of the driving circuit unit can be fabricated.

It will be apparent to those skilled in the art that various modifications and variations can be made in the liquid crystal display device of the present invention and the method of fabricating the same without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   an image display unit having unit pixels arranged thereon in a matrix;
   a driving circuit unit applying a driving signal to the image display unit, wherein the driving circuit unit includes,
   a gate driver for supplying gate signals to gate lines of the display unit;
   a data driver for applying data signals to data lines;
   an output buffer block within the gate driver;
   a level shifter in the driving circuit unit;
   a timing controller for generating control signals to be supplied to the gate driver and the data driver by receiving signals inputted from an exterior;
   a DC-DC (Direct Current-Direct Current) converter for converting a DC voltage input from the exterior into a DC voltage required for driving a liquid crystal display panel;
   a DA (Digital-to-Analog) converter for converting a digital signal inputted from the exterior into an analog signal;
   a gamma voltage generator;
   a shift resister for storing the control signals inputted from the timing controller; and
   a common voltage driver for adjusting a common voltage;
   a first CMOS by paring a LDD TFT with a PMOS; and
   a second CMOS by pairing a GOLDD TFT with the PMOS,
   wherein the output buffer block within the gate driver, the level shifter in the driving circuit unit, a pixel switching TFT in the display unit, and all other devices driven by high voltage more than 10V are formed by the second CMOS adopting the GOLDD TFT, and
   wherein the timing controller, the shift resistor within the data driver, the DC-DC converter, the common voltage driver, and all other devices driven by a low voltage less than 10V are formed by the first CMOS adopting the LDD TFT.

2. The device of claim 1, wherein:
   the data driver includes:
      the shift resister for storing the control signal inputted from the timing controller;
      the digital-to-analog converter (DAC) for converting a control signal inputted from the shift resister into an analog signal for the image display unit; and
      a first output buffer block for applying a control signal inputted from the DAC to the data lines; and
   the gate driver includes:
      the shift resister;
      the level shifter for carrying the control signal inputted from the shift resister to a specific level; and
      a second output buffer block for applying a control signal inputted from the level shifter to the gate lines of the image display unit.

3. The device of claim 1, wherein the LDD TFT, the GOLDD TFT, and the PMOS comprise:
   first, second and third active layers on a transparent substrate; a gate insulating layer over the active layers;
   first, second and third gate electrodes on the gate insulating layer, wherein each of the gate electrodes is formed at the first, second and third active layers, respectively;
   a first LDD region formed in the first active layer at sides of the first gate electrode, and a second LDD region formed in the second active layer under the second gate electrode; and
   source and drain regions in the first, second and third active layer at sides of the first, second and third gate electrodes.

4. The device of claim 1, wherein the LDD TFT comprises:
   a first active layer on a transparent substrate;
   a gate insulating layer over the first active layer;
   the first gate electrode on the gate insulating layer;

a first LDD region formed in the first active layer, wherein the first LDD region is formed in the first active layer at sides of the first gate electrode; and source and drain regions in the first active layer at the sides of the first gate electrode.

5. The device of claim 1, wherein the GOLDD TFT comprises:

a second active layer on a transparent substrate;

a gate insulating layer over the second active layer;

the second gate electrode on the gate insulating layer; a second LDD region formed in the second active layer, wherein the second LDD region is formed in the second active layer under the second gate electrode; and source and drain regions in the second active layer at sides of the second gate electrode.

6. The device of claim 1, wherein the PMOS comprises:

a third active layer on a transparent substrate;

a gate insulating layer over the third active layer;

the third gate electrode on the gate insulating layer; and source and drain regions in the third active layer at sides of the third gate electrode.

* * * * *